United States Patent
Cyphers et al.

(10) Patent No.: US 6,882,530 B2
(45) Date of Patent: Apr. 19, 2005

(54) INTEGRATED COMPONENT RACK AND AC POWER DISTRIBUTION

(75) Inventors: Robert C. Cyphers, Fremont, CA (US); Kenneth A. Lown, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/404,243

(22) Filed: Mar. 31, 2003

(65) Prior Publication Data

US 2004/0190241 A1 Sep. 30, 2004

(51) Int. Cl.[7] .................................................. G06F 1/16
(52) U.S. Cl. ........................ 361/686; 361/600; 361/679
(58) Field of Search ................................. 361/600–601, 361/611, 637, 640, 679, 686; 211/49.1, 126.15, 188

(56) References Cited

U.S. PATENT DOCUMENTS

| | | | | |
|---|---|---|---|---|
| 4,674,031 A | * | 6/1987 | Siska, Jr. .................... 700/79 |
| 5,563,455 A | * | 10/1996 | Cheng ......................... 307/41 |
| 6,124,714 A | * | 9/2000 | McNulty et al. ............ 324/418 |
| 6,388,190 B1 | * | 5/2002 | Laukhuf et al. ............... 174/48 |
| 6,452,805 B1 | * | 9/2002 | Franz et al. ................. 361/724 |
| RE38,004 E | * | 2/2003 | Cheng et al. ................. 307/41 |

* cited by examiner

*Primary Examiner*—Yean-Hsi Chang
(74) *Attorney, Agent, or Firm*—Martine Penilla & Gencarella, LLP

(57) ABSTRACT

A network system and computer component device rack having an integrated AC power distribution system is provided. The device rack and power distribution system includes a device rack frame having a plurality of locations for receiving network system and computer component devices within. The plurality of locations stacks network system and computer component devices one over another in a generally vertical orientation. A pair of AC power sequencers are mounted on an inner side panel, and a pair of power strips is provided along a rear edge. A plurality of compound angle AC jumper cords are provided for connecting network system and computer component devices to a plurality of power outlet receptacles on the pair of power strips.

19 Claims, 9 Drawing Sheets

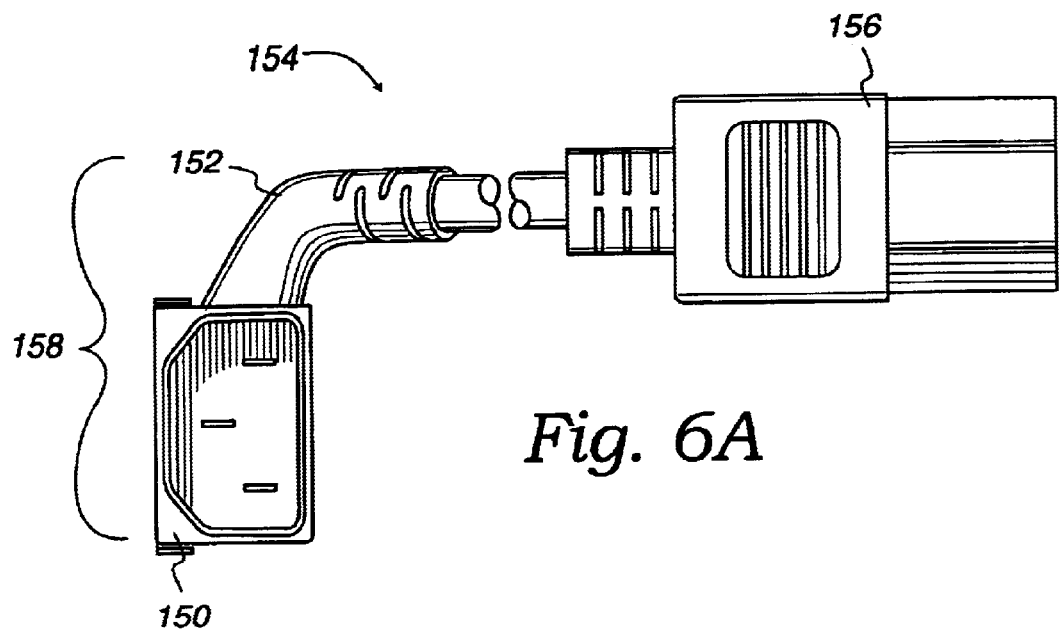
*Fig. 6A*
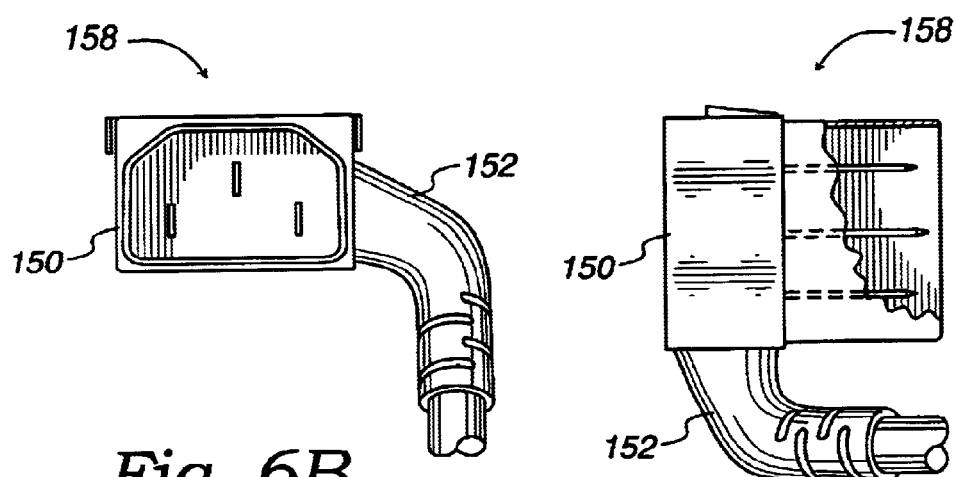
*Fig. 6B*
*Fig. 6C*

INTEGRATED COMPONENT RACK AND AC POWER DISTRIBUTION

BACKGROUND OF THE INVENTION

1. Field of the Invention

The present invention relates generally to computer network and network system components, and more specifically to computer network and system racks to provide maximum efficient device space.

2. Description of the Related Art

Computer network server system and related components are typically housed in racks configured to assimilate a plurality of component devices. System racks provide efficient organization for the plurality of components for ease of access, serviceability, expandability, power distribution, cooling, and the like.

A typical prior art system rack includes power distribution, sequencing, and regulation units, and space to receive a plurality of component devices such as network servers, routers, mass storage devices, tape back-up devices, and other similar related component devices, in addition to providing for serviceability access, power cord routing, air circulation and the like. In typical prior art system racks, generally accepted and standardized sizes for the various component devices provide for efficient space utilization, ease and predictability of system configuration, serviceability, and facility location. A "rack unit" is generally accepted as being approximately 1.75 inches in height, and 17.5 inches in width, with a depth ranging from approximately 18 inches to approximately 36 inches to accommodate a plurality of component devices.

In a typical prior art system rack, a plurality of component devices are stacked within the rack, with a typical configuration accommodating up to 16 dual input component devices or 32 single input component devices. In a bottom region of the system rack, power sequencers having a usual dimension of approximately two rack units are positioned to provide power and power sequencing to the component devices housed within the system rack. Individual power cords are typically routed within the system rack from the power sequencers upwards through the system rack to each of the component devices.

In a typical prior art system rack, power sequencers consume space that could be more efficiently utilized for component devices, and power distribution within the system rack is generally inefficient and inhibits access to and serviceability of component devices. What is needed is an efficient system rack design and power distribution system to increase capacity, serviceability, and economy of space requirements.

SUMMARY OF THE INVENTION

Broadly speaking, the present invention fills these needs by providing a network system and computer component device rack having an integrated AC power distribution system. The present invention can be implemented in numerous ways, including as a process, an apparatus, a system, a device, and a method. Several embodiments of the present invention are described below.

In one embodiment, an integrated computer component rack is disclosed. The integrated computer component rack includes a component rack frame having a frame front, a frame rear, and two frame sides, and mounting rails within the component rack frame for affixing computer components within the integrated computer component rack. Also included are a pair of power sequencers. The pair of power sequencers are positioned on an interior of one of the two frame sides. Further, a pair of power strips are provided. Each of the pair of power strips has a plurality of power outlet receptacles. The pair of power strips is configured to receive sequenced power from the pair of power sequencers, and to distribute sequenced power through the plurality of power outlet receptacles.

In another embodiment, a power distribution system in an integrated computer and server component rack is disclosed. The power distribution system includes a pair of power sequencers. Each of the pair of power sequencers is capable of receiving two 220 volt inputs, and of delivering two 220 volt outputs. The power distribution system further includes a pair of power strips for distributing sequenced power to component devices housed within the integrated computer and server component rack. Each of the pair of power strips receives input power from one of the pair of power sequencers.

In still a further embodiment, a network system and computer component device rack having an integrated AC power distribution system is disclosed. The network system and computer component device rack having an integrated AC power distribution system includes a device rack frame having a front, a back, and two sides. Each of the front, the back, and the two sides has an inner surface and an outer surface. The inner surface is defined within the device rack. The network system and computer component device rack having an integrated AC power distribution system further includes a plurality of locations for receiving network system and computer component devices. The plurality of locations stacks network system and computer component devices one over another in a generally vertical orientation. Also included is a pair of AC power sequencers capable of receiving two supply lines of 220 volt AC power and capable of providing two sequenced power output lines of 220 volts AC power. Further, a pair of power strips is provided. Each power strip includes a plurality of power outlet receptacles and each power strip is capable of receiving two inputs of sequenced 220 volt AC power. The network system and computer component device rack having an integrated AC power distribution system also includes a plurality of compound angle AC jumper cords for connecting network system and computer component devices to the plurality of power outlet receptacles on the pair of power strips. Each of the pair of AC power sequencers is positioned on the inner surface of one of the two sides within the network system and computer component device rack.

Advantages and benefits of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 6A shows a compound angle AC jumper cord in accordance with one embodiment of the invention.

FIG. 6B shows a front view of the power strip end of compound angle AC jumper cord in accordance with one embodiment of the invention.

FIG. 6C shows a top view of the power strip end of compound angle AC jumper cord in accordance with an embodiment of the invention.

DETAILED DESCRIPTION OF THE PREFERRED EMBODIMENTS

An invention for a system rack design and power distribution system is disclosed. In preferred embodiments, a network system and computer component device rack having an integrated AC power distribution system is described. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
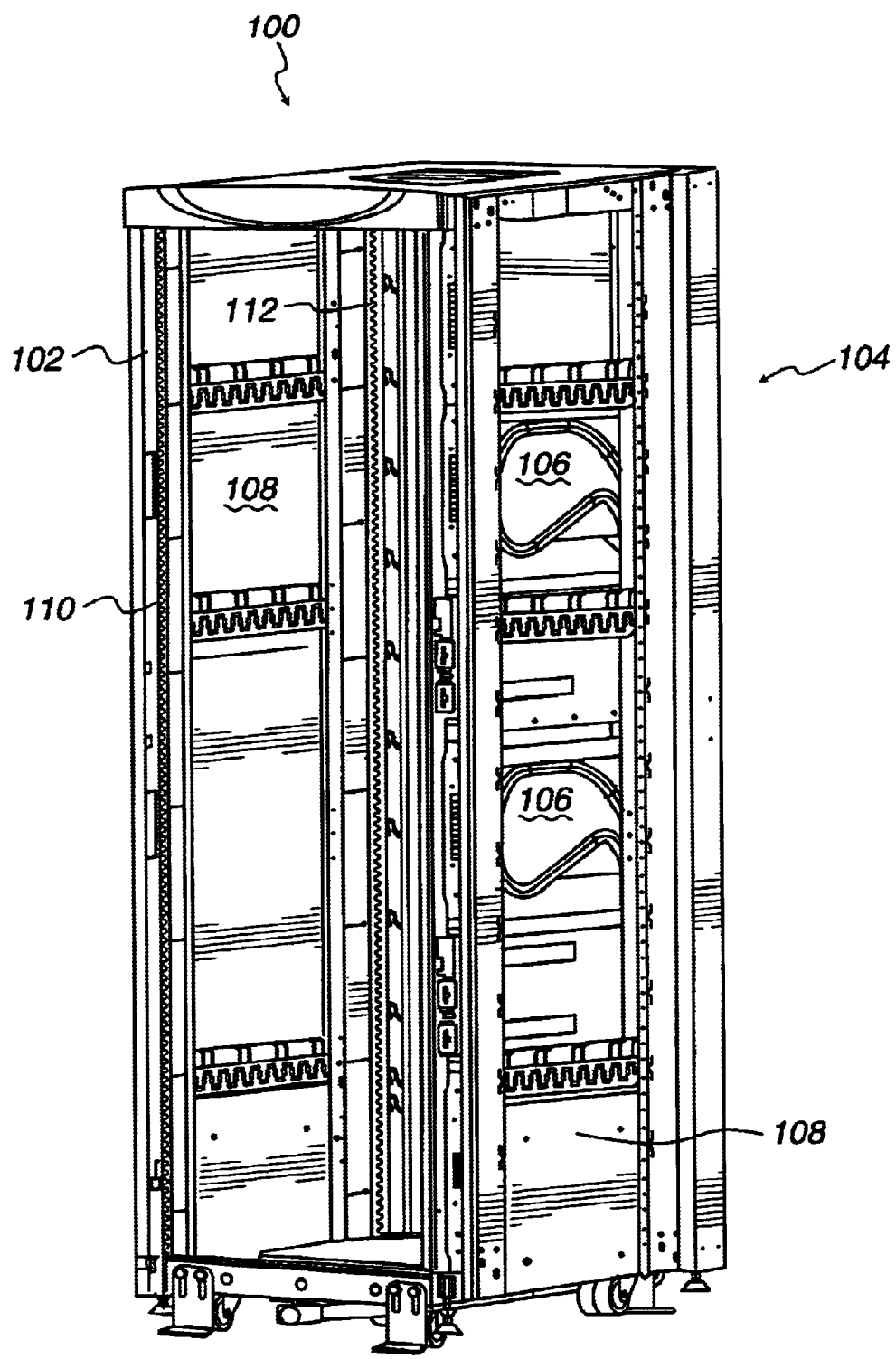
FIG. 1 shows a front view of a system rack in accordance with one embodiment of the present invention.

FIG. 1 shows a front view of a system rack 100 in accordance with one embodiment of the present invention. In the illustrated embodiment, system rack 100 includes a front 102 side, a rear 104 side, and sides 108. A front device connection rail 110 runs the length of system rack 100 along opposing edges of front 102 providing for mounting and connection of a plurality of devices (not shown) stacked within the interior of system rack 100. A rear device connection rail 112 runs the length of system rack 100 along opposing edges of rear 104 of system rack 100 providing corresponding rear mounting and connection. Both front device connection rail 110 and rear device connection rail 112 are within system rack 100.

A pair of power sequencers 106 are illustrated positioned along and within side 108. In one embodiment, power sequencers 106 positioned along and within side 108 provide for zero rack unit power sequencing and distribution. Zero rack unit power sequencing and distribution provides for more efficient use and implementation of system rack 100 by freeing up rack unit space within system rack 100 to accommodate additional component devices that in prior art racks is consumed by power sequencers. Additionally, side 108 is configurable to provide improved access to power sequencers 106 enhancing serviceability. By positioning power sequencers 106 unobstructed by side panels, power sequencers are easily accessible, can be removed without removing rack devices, and power sequencer status is easily viewable.

Figure 2:
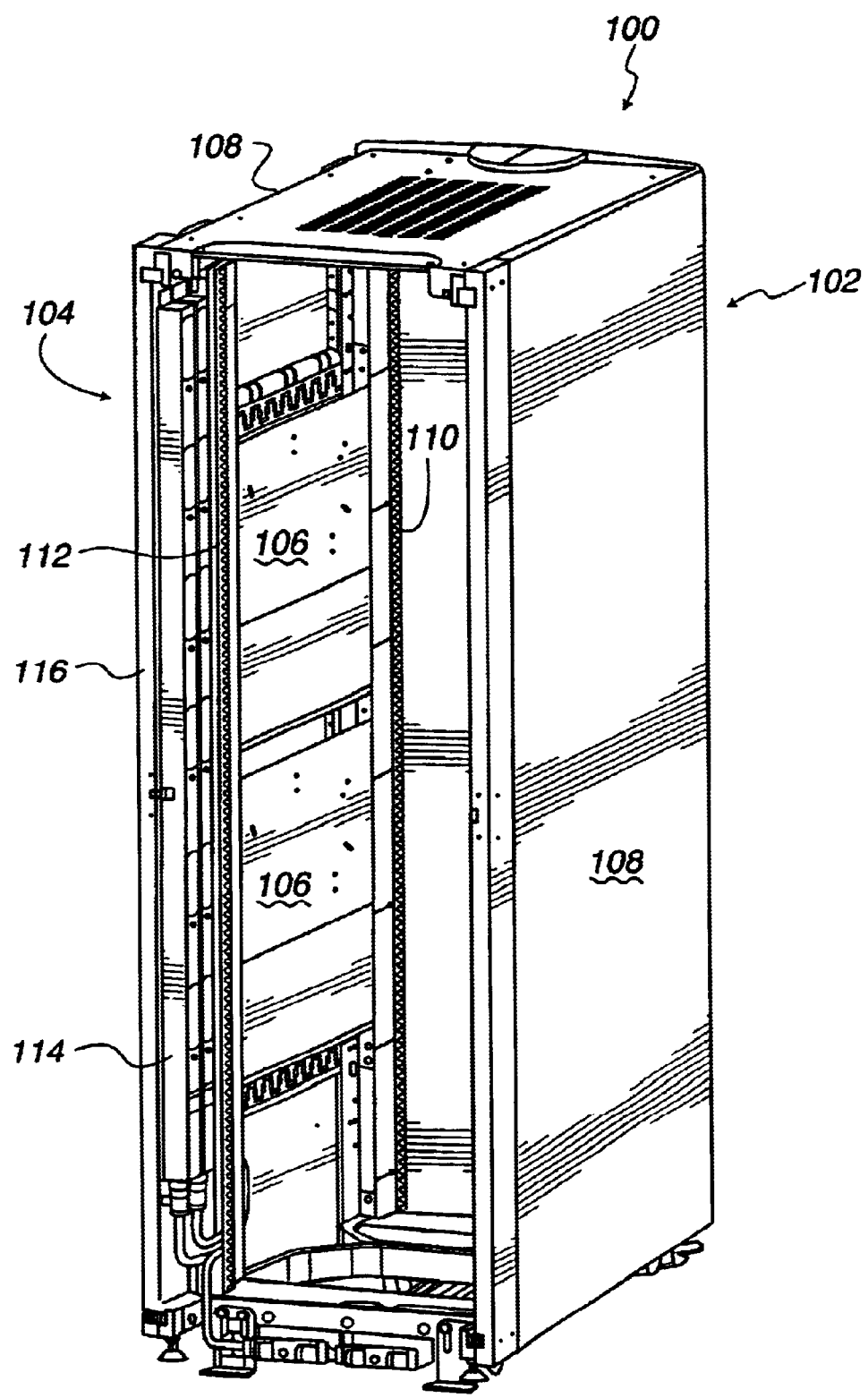
FIG. 2 shows a rear view of a system rack in accordance with one embodiment of the present invention.

FIG. 2 shows a rear view of a system rack 100 in accordance with one embodiment of the present invention. Front device connection rail 110 and front 102 are facing to the rear of system rack 100 in FIG. 2. Rear device connection rail 112 is shown within system rack 100, and power sequencers 106 are along and within side 108. Power strips 114 run along side 108 within system rack 100 in rear 104. In one embodiment, a space (not shown in FIG. 2) is provided between power strips 114, and between power strips 114 and rear edge 116 of system rack 100. As will be described in greater detail below in reference to FIGS. 4 and 5, the space between power strips 114, and between power strips 114 and rear edge 116 of system rack 100, provide channels for routing AC jumper cords connecting component devices (not shown) to power strips 114.

Figure 3:
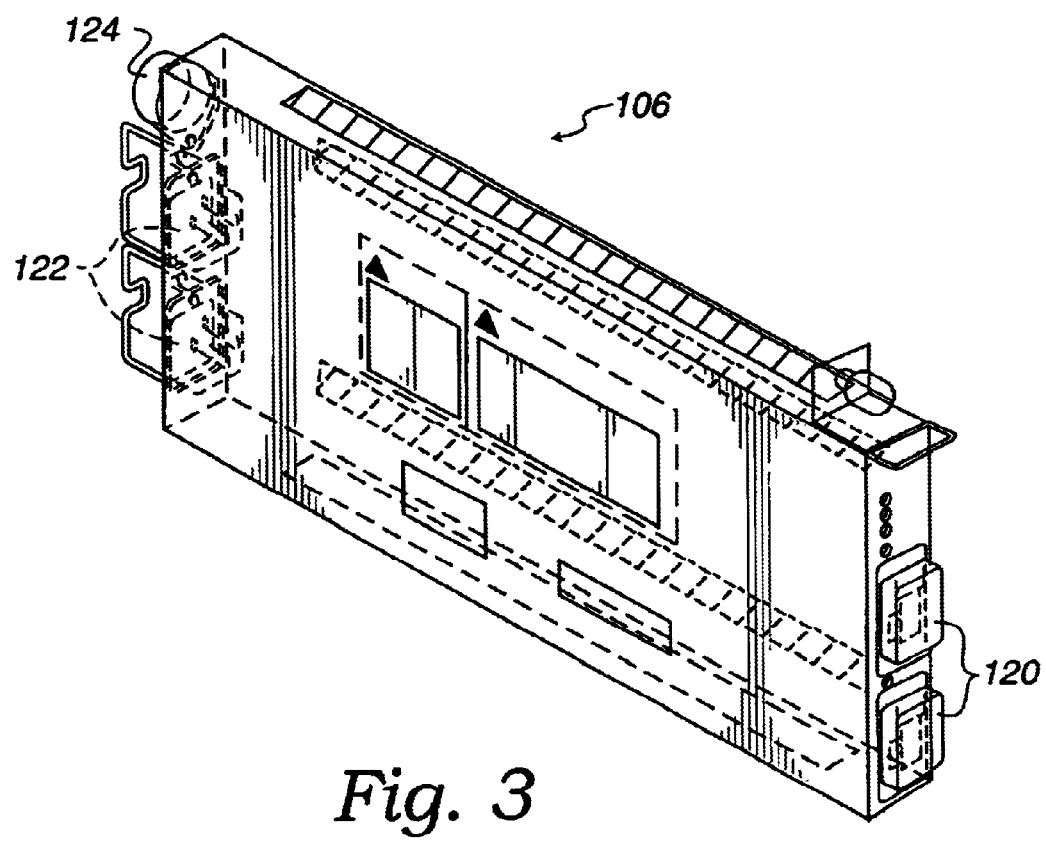
FIG. 3 shows a power sequencer in accordance with one embodiment of the invention.

FIG. 3 shows a power sequencer 106 in accordance with one embodiment of the invention. Power sequencer 106 includes power inputs 122 for two 220V, 20A, power supply lines from facility supply, and one power output 124 for supplying sequenced power to power strip 114. In one embodiment, power input 122 receives power from facility supply through a power input panel (not shown) which routes four 220V, 20A power inputs from facility supply to power sequencers 106, with two supply lines feeding each of two power sequencers 106 in each system rack 100 (see FIGS. 1 and 2) at power inputs 122. Switches 120 are provided for selectively securing power from one or both power inputs 122 at power sequencer 106.

As described above, power sequencers 106 are positioned along and within side 108 of system rack 100 (see FIGS. 1 and 2). The zero rack unit design of power sequencers 106 provide for additional rack space within system rack 100 for component devices. In one embodiment, power output 124 provides sequenced power to one of two powers trips 114 (see FIG. 2), so that a pair of power sequencers 106 configured to system rack 100 provide sequenced power to each of two power strips 114 positioned along the rear of system rack 100. Within power sequencer 106 are included filters and sequenced relays (not shown) for providing sequenced power to component devices connected to power strips 114. Component devices require known power supply and sequencing, and the power sequencer 106 of the present invention defines and distributes required power distribution components within system rack 100 to provide required power and sequencing while consuming no component device space.

Figure 4:
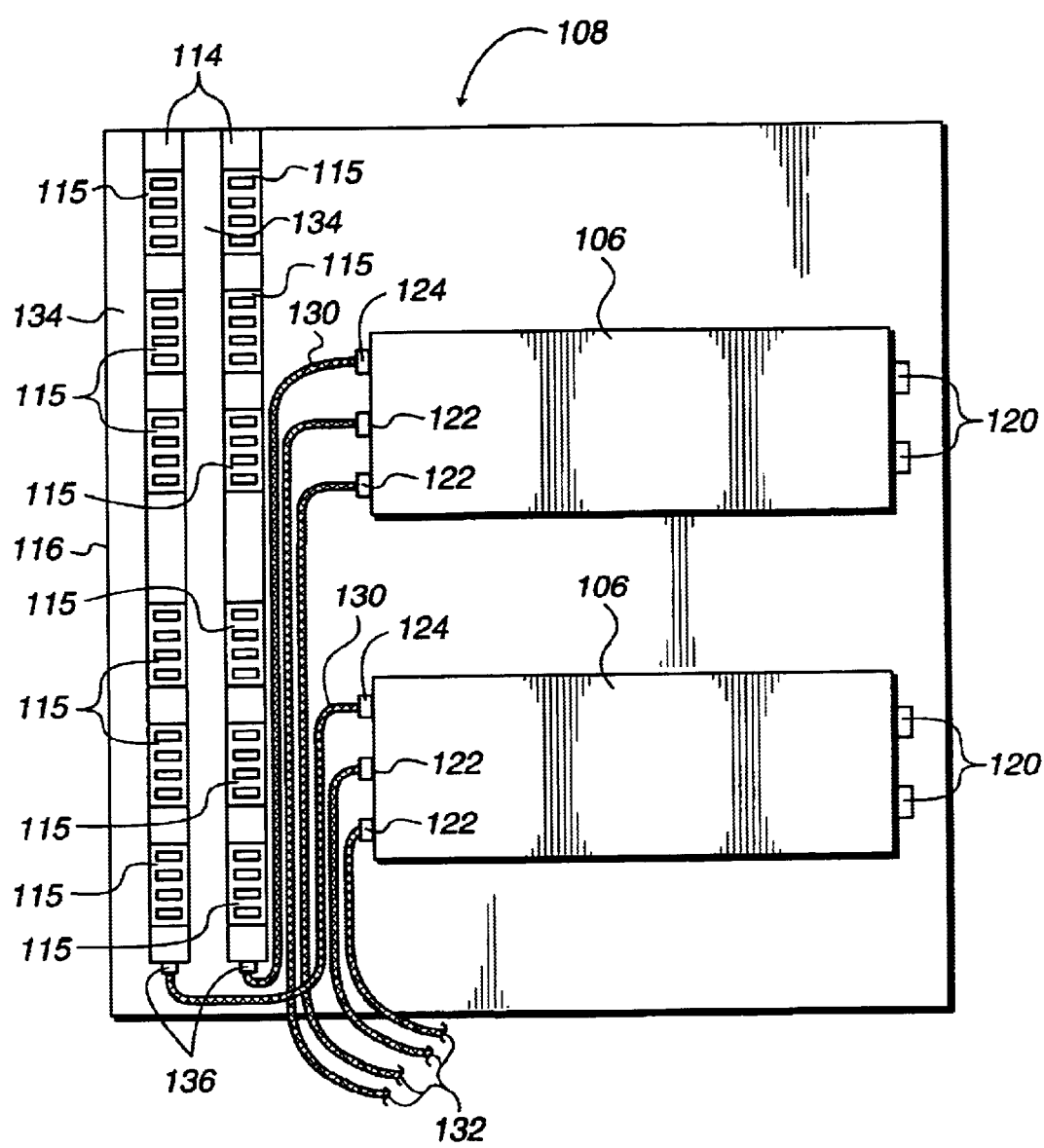
FIG. 4 illustrates a configuration of power sequencers along and within a side of the system rack in accordance with one embodiment of the present invention.

FIG. 4 illustrates a configuration of power sequencers 106 along and within side 108 in accordance with one embodiment of the present invention. Facility power supply 132 is routed to each of two power inputs 122 of power sequencers 106. Power outputs 124 supply sequenced power to power strips 114 at power strip inputs 136. The illustrated embodiment has power strip inputs 136 positioned at the bottom of power strips 114, and other embodiments include power strip inputs 136 at any desirable location along power strips 114. Switches 120 on power sequencers 106 provide for selectively securing input power from one or both power inputs 122 at the power sequencer 106.

Power strip power supply 130 is routed from each of power outputs 124 of power sequencers 106. In one embodiment, power strip supply 130 is a power distribution cable capable of delivering two 220V, 16A outputs to power strips 114. Power strips 114, in one embodiment, are capable of receiving two sequenced power inputs of 220V at 16A. Power voltage and amperage ratings can be modified, in one embodiment, in accordance with local electrical requirements and standards. When sequenced power is supplied to power strips 114, sequenced power distribution is available to component devices (not shown) at power outlets 115. Power outlets 115 can be positioned and grouped along power strips 114 in any desired manner to provide desired power to device components, and in the illustrated embodiment, 24 power outlets 115 are provided on each power strip 114. In one embodiment of the invention, the dual power strips 114 having a plurality of outlets 115 enable connection of up to 23 dual input device components or 38 single input device components. In another embodiment, the dual power strips 114 having a plurality of outlets 115 enable connection of up to 38 dual or single input device components, so long as each of the 38 dual or single input device components is one rack unit in dimension.

In the illustrated embodiment, power strips 114 are positioned along side 108 within system rack 100 (see FIG. 2) to provide a channel 134 between the two power strips 114 and between the power strips 114 and a rear edge 116 of system rack 100. In one embodiment, channels 134 are provided for AC jumper cords (not shown in FIG. 4) routed between power strips 114 and component devices (not shown). AC jumper cords are configured to dress into channels 134 to minimize cable clutter and maximize access to and air circulation around component devices. In one embodiment, a door (not shown) attaches to rear edge 116 to enclose device components within system rack 100 (see FIG. 2, door not shown). When a door is attached to rear edge 116, channel 134 between power strips 114 and rear edge 116 remains in which to route AC jumper cords.

Figure 5:
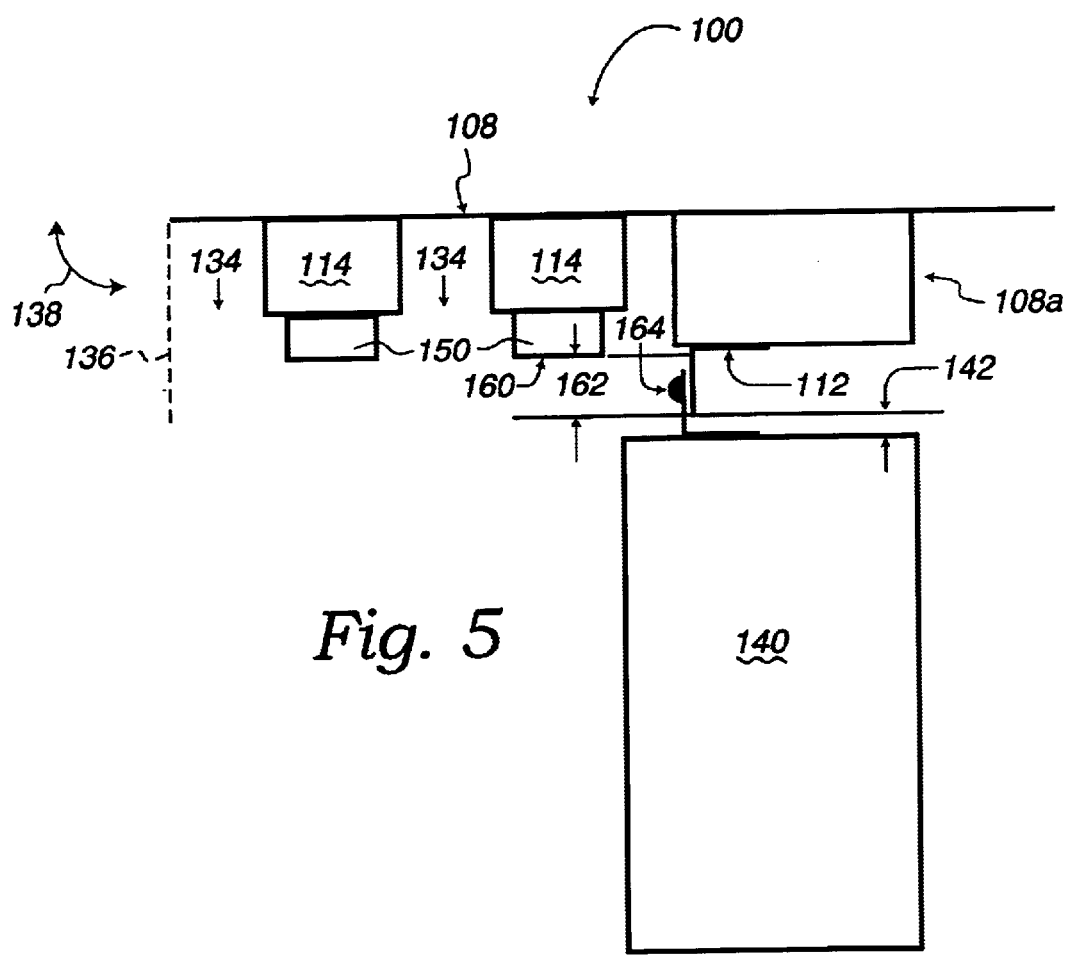
FIG. 5 is a top view of the rear portion of a system rack in accordance with one embodiment of the invention.

FIG. 5 is a top view of the rear portion of system rack 100 in accordance with one embodiment of the invention. As illustrated in FIG. 5, power strips 114 are routed along side 108 within system rack 100. Channels 134 are formed between power strips 114, and between power strips 114 and inside edges of door 136. In the illustrated embodiment, door 136 forms channel 134 along inside edges of door 136 and edge of power strip 114. Door 136 opens outward 138 leaving channel 134 open and accessible.

Plugs 150 are shown connected to power strips 114. In one embodiment, compound angle AC jumper cords, which are described in greater detail below, are provided for connecting component devices 140 to power strips 114. The compound angle (see FIGS. 6A–6F, 7A–7C) of compound angle AC jumper cords dresses the power cords within channel 134 minimizing cord/cable clutter and maximizing access, serviceability, and airflow circulation within system rack 100.

In the illustrated embodiment, component device 140 is represented connected to side bracing 108a of side 108 by rear device connection rail 112. Component device 140 is affixed to rear device connection rail 112 at attachment 164. As described above, one rack unit is approximately 17.5" wide. In one embodiment of the present invention, device components 140 are mounted within system rack 100 at rear device connection rails 112 and front device connection rails 110 (see FIG. 1) with a clearance 142 within a range of approximately 2 mm to approximately 10 mm, and in one embodiment, the clearance 142 is about 6 mm. Additionally, in one embodiment, a clearance 162 between back surface 160 of plug 150 and device components 140 enables access to attachment 164 for easy removal and replacement of device components 140.

Figure 6D:
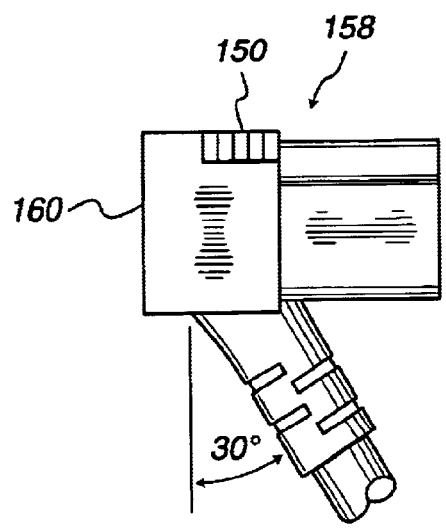
FIG. 6D is a side view of the power strip end of compound angle AC jumper cord in accordance with one embodiment of the invention.

FIG. 6A shows a compound angle AC jumper cord 154 in accordance with one embodiment of the invention. Compound angle AC jumper cord 154 includes a component device end 156 and a power strip end 158. Illustrated on the power strip end 158 are plug 150 and compound angle 152. Compound angle AC jumper cord 154 is provided to connect component devices 140 (see FIG. 5) with power strip 114 (see FIGS. 4 and 5). In one embodiment, the compound angle 152 feeds the compound angle AC jumper cord 154 laterally out and back from plug 150 into channel 134 (see FIGS. 4 and 5) when compound angle AC jumper cord 154 is connected to power strip 114. FIGS. 6B–6F, and 7A–7C are provided to illustrate various features of compound AC jumper cord 154.

FIG. 6B shows a front view of power strip end 158 of compound angle AC jumper cord 154 in accordance with one embodiment of the invention. Compound angle 152 extends out from the side of plug 150 which connects to power strip 114 (see FIGS. 4 and 5), and back in order to route compound angle AC jumper cord 154 into channel 134 (see FIGS. 4 and 5). As shown in FIG. 6B, the attached cord extends outward from a side of plug 150, and the compound angle 152 essentially forms first a 90 degree elbow. As will be described and illustrated below, the compound angle 152 also routes the attached cord backwards at an angle of approximately 30 degrees from a plane parallel to a back surface of plug 150.

FIG. 6C shows a top view of the power strip end 158 of compound angle AC jumper cord 154 in accordance with an embodiment of the invention. Illustrated are plug 150, and compound angle 152 which routes the compound angle AC jumper cord 154 into channel 134.

FIG. 6D is a side view of power strip end 158 of compound angle AC jumper cord 154 in accordance with one embodiment of the invention. In FIG. 6D, a second part of the compound angle is illustrated. As described above, a first part of the compound angle routes the cord extending out from the side of plug 150 through an essentially 90 degree elbow. The second part of the compound angle routes the attached cord backwards approximately 30 degrees from a plane parallel to a back surface 160 of plug 150. In this manner, a plurality of compound angle AC jumper cords 154 can be attached to power strip 114 (see FIGS. 4 and 5), and can be nested to dress the cords into channel 134 (see FIGS. 4 and 5).

Figure 6E:
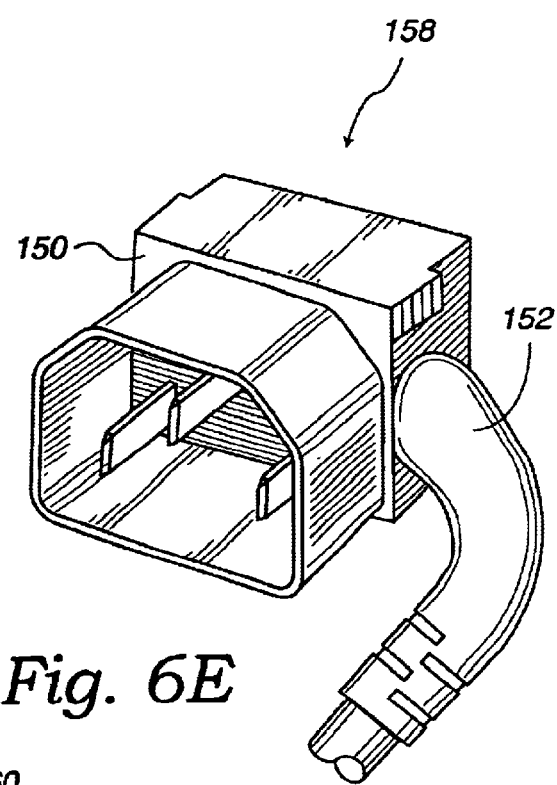
FIG. 6E shows an isometric view of the power strip end of compound angle AC jumper cord in accordance with one embodiment of the invention.

FIG. 6E shows an isometric view of the power strip end 158 of compound angle AC jumper cord 154 in accordance with one embodiment of the invention. Illustrated are plug 150 and compound angle 152 which, as illustrated, routes the attached cord out and back. Nesting of a plurality of compound angle AC jumper cords 154 is illustrated below in FIGS. 7A–7C.

Figure 6F:
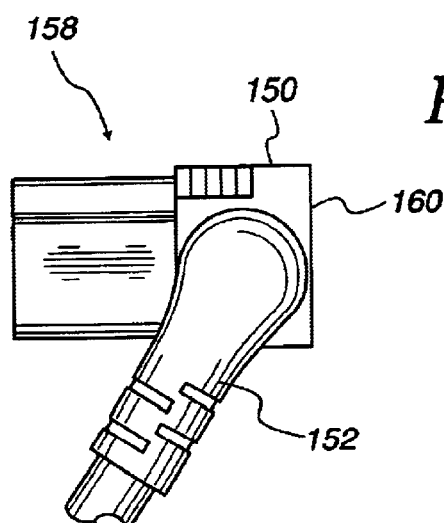
FIG. 6F shows another side view of the power strip end of compound angle AC jumper cord in accordance with an embodiment of the invention.

FIG. 6F shows another side view of power strip end 158 of compound angle AC jumper cord 154 in accordance with an embodiment of the invention. As in previous illustrations, plug 150 and compound angle 152 are identified. Additionally, a back surface 160 of plug 150 is identified. In one embodiment, compound angle 152 routes the attached cord through an approximately 90 degree angle outward from the side of plug 150 and down. Additionally, the compound angle 152 routes the attached cord backward at an angle of approximately 30 degrees off a plane parallel to a back surface 160 of plug 150.

Figure 7A:
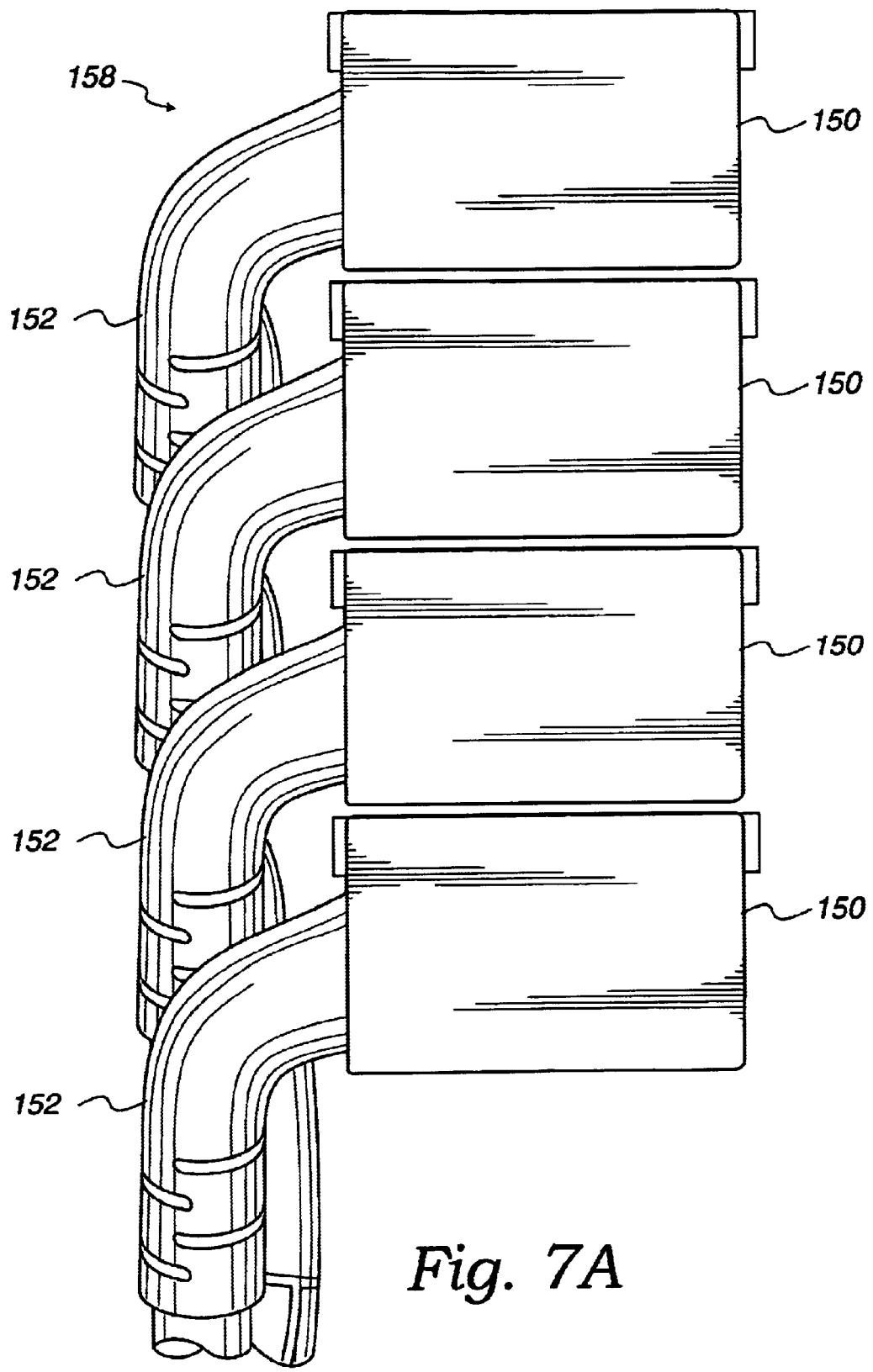
FIG. 7A shows a plurality of power strip ends and the respective compound angles nested and dressing attached cords into a desired location in accordance with one embodiment of the invention.
Figure 7B:
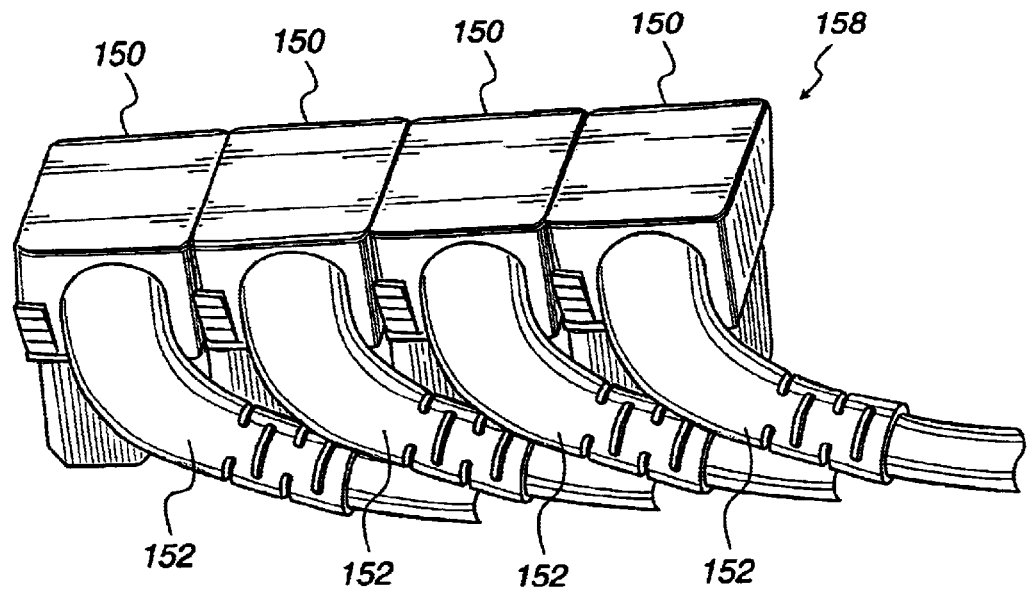
FIG. 7B illustrates a plurality of power strip ends of compound angle AC jumper cords in accordance with an embodiment of the invention.
Figure 7C:
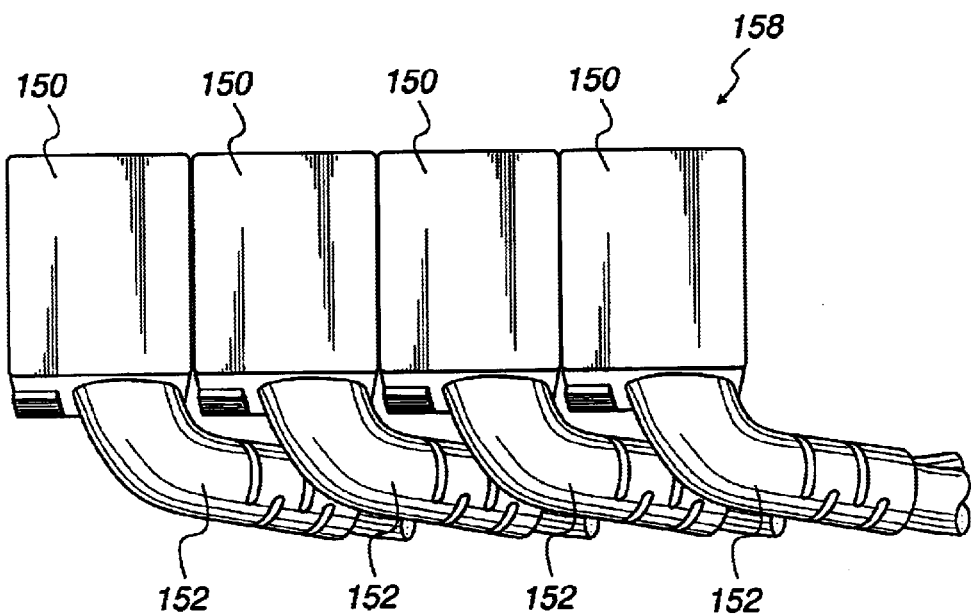
FIG. 7C shows yet another angle of a plurality of plugs of the power strip end of compound angle AC jumper cord in accordance with an embodiment of the present invention.

FIGS. 7A–7C are provided to illustrate a plurality of power strip ends 158 of compound angle AC jumper cords 154 and the nesting of multiple cords. FIG. 7A shows a plurality of power strip ends 158 and the respective compound angles 152 nested and dressing attached cords into a desired location in accordance with one embodiment of the invention. In one embodiment, the attached cords dress into channel 134 (see FIGS. 4 and 5). As illustrated in FIG. 7A, plug 150 is designed to connect to, for example, power strip 114 (see FIGS. 4 and 5) such that a plurality of plugs can be arranged together consuming a minimal amount of space and presenting an essentially flat surface. Additionally, compound angles 152 dress the attached cords out and back from plug 150. In this manner, multiple plugs 150 having multiple compound angles 152 will dress the attached cords, the compound angle AC jumper cord 154 (see FIG. 6A), back and into channel 134. In one embodiment, the minimal space requirement, and the nesting of a plurality of compound angle AC jumper cords 154, provide for the sequenced power connection for the plurality of component devices within system rack 100 (see FIGS. 1 and 2), while minimizing cable or jumper cord clutter, increased accessibility to the component devices, and improved serviceability for any of the incorporated component devices or for the system rack 100 itself.

FIG. 7B illustrates a plurality of power strip ends 158 of compound angle AC jumper cords 154 (see FIG. 6A) in accordance with an embodiment of the invention. FIG. 7B presents a side view of the plurality of plugs 150 and compound angles 152 to illustrate the minimal space requirements as well as the nesting of multiple compound angle AC jumper cords 154. In one embodiment, the nested cords dress neatly into channel 134 (see FIGS. 4 and 5).

FIG. 7C shows yet another angle of a plurality of plugs 150 of the power strip end 158 of compound angle AC jumper cord 154 (see FIG. 6A) in accordance with an embodiment of the present invention. FIG. 7C provides another perspective of the nesting quality or characteristic of compound angle AC jumper cord 154 when a plurality of cords are attached to power strip 114 (see FIGS. 4 and 5) with cords dressing into channel 134 (see FIGS. 4 and 5).

In summary, the present invention provides an innovative system rack for computer networks, network systems, and related components. The system rack integrates zero rack unit power sequencers along and within a side panel of the system rack freeing up valuable rack space for component devices. A power strip is provided along a rear edge of the system rack, and innovative compound angle AC jumper cords that connect component devices to sequenced power. The compound angle AC jumper cords dress power cords into a channel to minimize cord and cable clutter, and to increase access and serviceability of the system rack and integrated components. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims and equivalents thereof.

What is claimed is:

1. An integrated computer component rack, comprising:
   a component rack frame having a frame front, a frame rear, and two frame sides;
   mounting rails within the component rack frame for affixing computer components within the integrated computer component rack;
   a pair of power sequencers, the pair of power sequencers being positioned on an interior of one of the two frame sides, each of the pair of power sequencers including inputs for two supply lines and an output for a single power distribution line, the single power distribution line delivering a 220 volt supply of sequenced power at 16 amps; and
   a pair of power strips, each of the pair of power strips having a plurality of power outlet receptacles, the pair of power strips being configured to receive sequenced power from the pair of power sequencers and to distribute sequenced power through the plurality of power outlet receptacles.

2. The integrated computer component rack of claim 1, further comprising:
   a compound angle AC jumper cord for connecting computer components within the integrated computer component rack to the pair of power strips for distributing sequenced power from the pair of power sequencers to the computer components within the integrated computer component rack.

3. The integrated computer component rack of claim 2, wherein the compound angle AC jumper cord includes a compound angle to route the compound angle AC jumper cord into a channel along one of the two frame sides.

4. The integrated computer component rack of claim 1, wherein each of the pair of power sequencers includes a switch to secure supply power to each of the pair of power sequencers at each of the pair of power sequencers.

5. The integrated computer component rack of claim 1, wherein the integrated computer component rack supports up to 23 dual input component devices.

6. The integrated computer component rack of claim 1, wherein the integrated computer component rack supports up to 38 single input component devices.

7. In an integrated computer and server component rack, a power distribution system, comprising:
   a pair of power sequencers, each of the pair of power sequencers capable of receiving two 220 volt inputs, and delivering 220 volt output; and
   a pair of power strips for distributing sequenced power to component devices housed within the integrated computer and server component rack, each of the pair of power strips receiving input power from one of the pair of power sequencers.

8. In an integrated computer and server component rack, a power distribution system as recited in claim 7, further comprising:
   a compound angle AC jumper cord configured to connect a component device housed within the integrated computer and server component rack and distributed power from one of the pair of power strips.

9. In an integrated computer and server component rack, a power distribution system as recited in claim 8, wherein the component device includes any one of a router, a network server, a mass storage device, and a tape backup device.

10. In an integrated computer and server component rack, a power distribution system as recited in claim 8, wherein a compound angle of the compound angle AC jumper cord routes the compound angle AC jumper cord into a channel along a side and within the computer and server component rack, the routing of the compound angle AC jumper cord facilitating access to the component device housed within the integrated computer and server component rack.

11. In an integrated computer and server component rack, a power distribution system as recited in claim 7, wherein each of the pair of power sequencers includes a plurality of sequencing relays and an EMI filter for each 220 volt input.

12. In an integrated computer and server component rack, a power distribution system as recited in claim 7, wherein the two 220 volt outputs are at 16 amps.

13. In an integrated computer and server component rack, a power distribution system as recited in claim 7, wherein the pair of power sequencers is positioned on a side panel within the integrated computer and server component rack, the positioning enabling additional space within the integrated computer and server component rack to be utilized for computer and server components.

14. In an integrated computer and server component rack, a power distribution system as recited in claim 7, wherein each of the pair of power sequencers includes a pair of switches configured to secure power of the two 220 volt inputs at each of the pair of power sequencers.

15. In an integrated computer and server component rack, a power distribution system as recited in claim 7, wherein the integrated computer and server component rack and power distribution system support up to one of 23 dual input component devices and 38 single input devices.

16. A network system and computer component device rack having an integrated AC power distribution system, comprising:
 a device rack frame having a front, a back, and two sides, and each of the front, the back, and the two sides having an inner surface and an outer surface, the inner surface being defined within the device rack;
 a plurality of locations for receiving network system and computer component devices, the plurality of locations stacking network system and computer component devices one over another in a generally vertical orientation;
 a pair of AC power sequencers, each of the pair of AC power sequencers capable of receiving two supply lines of 220 volt AC power and capable of providing sequenced power output of 220 volts AC power;
 a pair of power strips, each power strip having a plurality of power outlet receptacles and each power strip capable of receiving two inputs of sequenced 220 volt AC power;
 a plurality of compound angle AC jumper cords for connecting network system and computer component devices to the plurality of power outlet receptacles on the pair of power strips,
 wherein each of the pair of AC power sequencers is positioned on the inner surface of one of the two sides within the network system and computer component device rack.

17. The network system and computer component device rack having an integrated AC power distribution system as recited in claim 16, wherein the network system and computer component device rack having an integrated AC power distribution system supports up to 23 dual input network system and computer component devices.

18. The network system and computer component device rack having an integrated AC power distribution system as recited in claim 16, wherein the network system and computer component device rack having an integrated AC power distribution system supports up to 38 single input network system and computer component devices.

19. The network system and computer component device rack having an integrated AC power distribution system as recited in claim 16, wherein the network system and computer component device rack having an integrated AC power distribution system supports up to 38 network system and computer component devices, each network system and computer component device being one of a single input device and a dual input device, and each network system and computer component device being one rack unit in dimension.

* * * * *